United States Patent [19]

Neuhoff et al.

[11] 4,295,271

[45] Oct. 20, 1981

[54] METHOD OF SOLDERING A LEAD TO A SINTERED LEAD PAD

[75] Inventors: Donald Neuhoff; Arthur H. Mones; Man K. Lam, all of Phoenix, Ariz.

[73] Assignee: Honeywell Information Systems Inc., Phoenix, Ariz.

[21] Appl. No.: 137,043

[22] Filed: Apr. 3, 1980

Related U.S. Application Data

[60] Division of Ser. No. 942,728, Sep. 15, 1978, abandoned, which is a continuation-in-part of Ser. No. 861,226, Dec. 16, 1977, abandoned.

[51] Int. Cl.[3] .............................................. H05K 3/34

[52] U.S. Cl. .................................. 29/840; 228/263 R

[58] Field of Search ............. 29/840 D; 106/1.13, 1.25; 228/263 G

[56] References Cited

U.S. PATENT DOCUMENTS

| | | | |
|---|---|---|---|
| 3,293,501 | 12/1966 | Martin | 106/1.13 X |
| 3,746,568 | 7/1973 | Rybarczyk | 106/1.13 X |
| 3,776,769 | 12/1973 | Buck et al. | 106/1.13 X |
| 3,960,777 | 6/1976 | Coyle | 106/1.25 X |
| 3,970,590 | 7/1976 | Hoffman et al. | 252/514 |
| 4,032,350 | 6/1977 | Greenstein | 106/1.13 |

OTHER PUBLICATIONS

Solders and Soldering by H. H. Manko, McGraw-Hill Book Co. (1964), pp. 102, 103, 124, 125, 180, 181, 182, 219-221, 288-290.

Gold Thick Film Conductors by M. V. Coleman and G. E. Gurnett, *Gold Bull.* 77, 10(3) 74-75.

*Primary Examiner*—Nicholas P. Godici
*Assistant Examiner*—C. J. Arbes
*Attorney, Agent, or Firm*—E. W. Hughes; W. W. Holloway, Jr.; N. Prasinos

[57] ABSTRACT

A solderable gold conductor composition is formed by dispersing gold and certain inorganic binders in an inert liquid vehicle composition which can be used to produce conductor patterns which patterns adhere to fired ceramic substrates and to which can be soldered leads of electronic components.

A method of soldering a copper lead to a lead pad on a substrate. A conductor pattern including at least one lead pad is printed on the substrate using a gold thick film paste composition. The gold composition is composed of finely divided gold particles and finely divided inorganic binder particles dispersed in an inert liquid vehicle, containing by weight 98-99 percent gold particles and complementally 2-1 percent of inorganic binder particles. The binder consists essentially by total weight of gold and binder of 0.6-0.2 percent copper, 0.2 percent lead, 0.2 percent cadmium and the balance being glass. The pattern is then fired to sinter the inorganic materials, and the fired pad is presoldered without the necessity for physically or chemically precleaning the pad prior to soldering. A presoldered copper lead of an electronic component, for example, is then soldered to the presoldered pad.

3 Claims, 3 Drawing Figures

METHOD OF SOLDERING A LEAD TO A SINTERED LEAD PAD

CROSS REFERENCE TO RELATED APPLICATION

This application is a division of application Ser. No. 942,728, filed on Sept. 15, 1978, now abandoned, which in turn was a continuation in part of application Ser. No. 861,226, filed Dec. 16, 1977, now abandoned.

BACKGROUND OF THE INVENTION

1. Field of the Invention

This invention relates to a method of soldering a lead to a lead pad of a sintered noble metal composition.

2. Description of the Prior Art

Conductor compositions which are applied to and fired on ceramic substrates usually comprise finely divided noble metal particles and inorganic binder particles. Such compositions are commonly applied to substrates as a "thick film," a dispersion of the inorganic materials of the compositions in an inert liquid medium or vehicle. The metallic component of the composition provides an electrical conductor having a low electrical resistance while the inorganic binders, such as glass, bonds the metal particles to the substrate.

The most relevant prior art known to applicants is that found in U.S. Pat. No. 3,970,590 which issued on July 20, 1976. This patent discloses gold conductor compositions which can by conventional thick film techniques produce conductor patterns and pads to which electronic components can be bonded using conventional thermal compression bonding techniques. The particular gold conductor compositions disclosed in the U.S. Pat. No. 3,970,590 have excellent adherence to ceramic substrates and such substrates coated with thick film dielectric layers composed, for example, of mixtures of alumina and glass. However, the strength of the solder bond, or joint between a pad made of the composition, a lead pad, and a copper lead precoated with solder varies from being unacceptably weak to being acceptably strong.

The major problem with the prior art gold conductor composition is that the strength of solder joints between lead pads which are made from some compositions within the range disclosed in U.S. Pat. No. 3,970,590 and copper electronic leads soldered to the pads with a 50% lead, 50% indium solder have widely varying strengths with some being unacceptably weak both initially and after being aged at elevated temperatures.

It is an object of this invention to provide an improved method of soldering leads to lead pads on a substrate.

It is another object of this invention to provide a method of soldering leads to lead pads composed of a sintered gold conductor composition in which the fired composition does not need to be physically or chemically cleaned prior to soldering beyond the action of noncorrosive fluxes.

It is still another object of this invention to provide a method of soldering presoldered leads to presoldered sintered lead pads composed of an improved gold conductor composition which optimizes the strength of solder bonds between leads of electronic components and sintered lead pads of the composition to which such leads are soldered which lead pads do not need to be physically or chemically cleaned prior to soldering.

SUMMARY OF THE INVENTION

This invention relates to a method of soldering presoldered leads to presoldered sintered lead pads composed of compositions of finely divided gold particles and finely divided inorganic binder particles dispersed in an inert liquid vehicle. The chemical composition of the binder and operative and preferred proportions of the gold and binder are set forth in Table 1. Part or all of the copper in the binder is present as metallic copper and the balance as compounds of copper, typically oxides with the lead being present as $PbF_2$, and the cadmium as CdO. A composition of a glass suitable for use in the binder is disclosed in U.S. Pat. No. 3,970,590 which issued on July 20, 1976. It should be noted that this glass contains a substantial amount of lead, substantially 50% by weight of the glass and a small amount of cadmium, substantially 2% by weight in addition to other ingredients.

TABLE I

| Component | Proportions (wt. %) Operative | Preferred |
|---|---|---|
| Gold | 98.-99. | 98.5 |
| Binder | | |
| Cu | 0.6-0.2 | 0.5 |
| Pb | 0.3-0.2 | 0.2 |
| Cd | 0.3-0.2 | 0.2 |
| Glass | 0.6-0.5 | 0.5 |

In these compositions there are normally 7-15 parts vehicle and complementally, 85-93 parts inorganic solids (gold plus inorganic binder), although these proportions may be varied depending upon the printing properties of the composition.

The fired conductors of this invention can be soldered using lead-indium solder to produce strong solder joints without it being necessary to preclean, either physically or chemically the fired conductors.

DETAILED DESCRIPTION OF THE INVENTION

Figure 1:
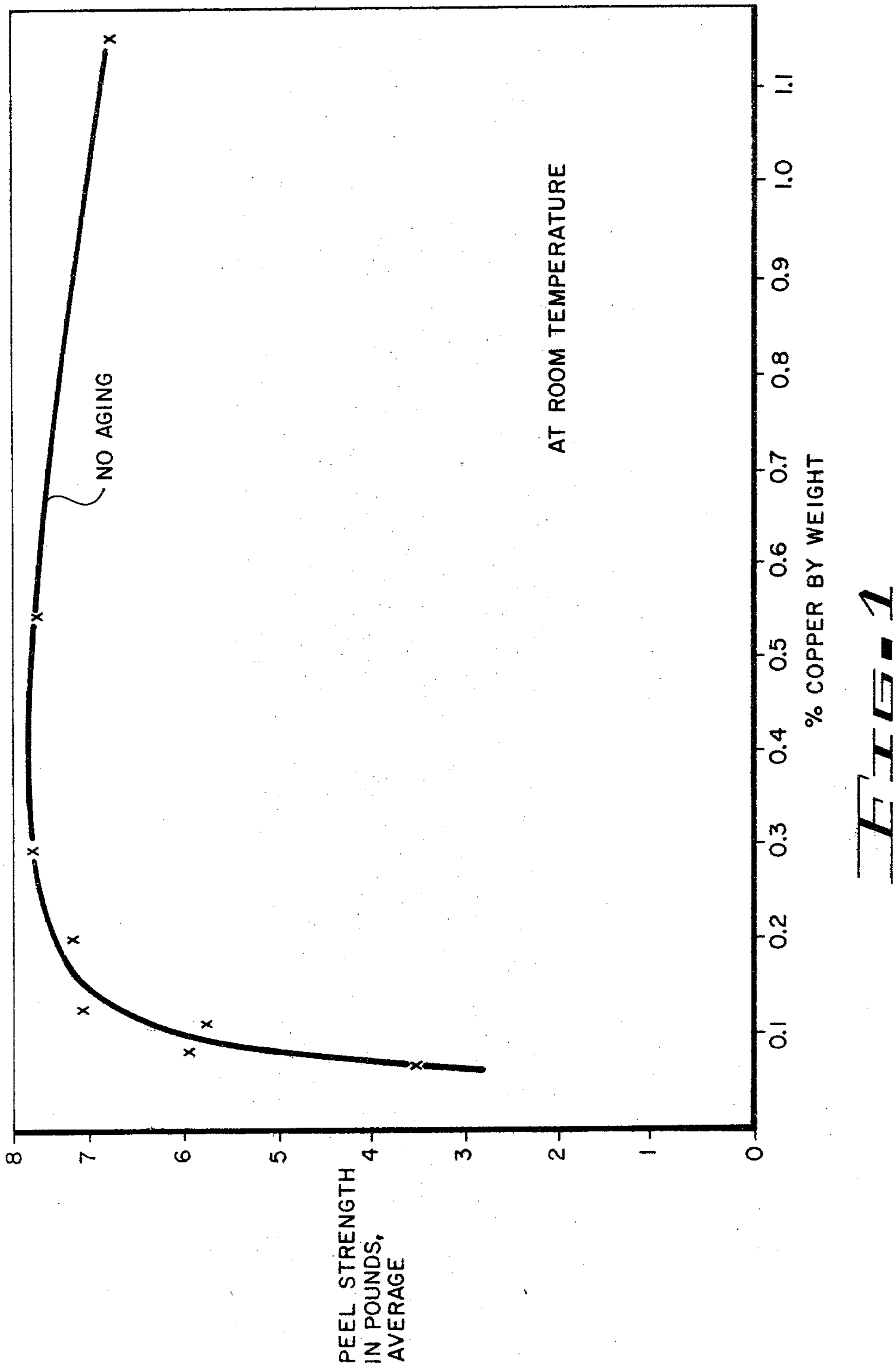
FIG. 1 is a graph of the relationship between the average peel strength in pounds of solder joints between wire leads and solder pads of conductor patterns using a 50% lead 50% indium solder as a function of the percent of copper by weight of the composition of the solder pads when the joints have not been aged at an elevated temperature.

Applicants have discovered that the amount of binder and particularly the amount of copper in the form of metallic copper or its oxides in the binder are critical in determining the solderability of the fired composition using a lead-indium solder while retaining good adhesion of the fired composition of a ceramic substrate such as one made from commercially pure, 96–97% alumina coated with a thin layer of a thick film dielectric of substantially 50 μm of alumina mixed with glass. The amount of binder to produce such a solderable composition is in the range of 1% to 2% by weight based on solids. If the amount of copper in the form of metallic copper or its oxides in the binder is too low, the strength of the solder bonds between electronic leads and lead pads made of the composition is too weak or small to produce an acceptable bond or joint, particularly after aging at temperatures to which it would be subjected in electronic devices. However, if the amount of copper is too high, the fired composition must be physically or chemically precleaned prior to soldering which creates unacceptable process problems and reliability problems because of possible damage to electronic components mounted on substrates on which the composition is fired.

The inorganic particles used in the composition of this invention, noble metal powders and inorganic binder powders, are usually described as finely divided powders, and are generally sufficiently finely divided to pass through a 200 mesh screen, preferably a 400 mesh screen (U.S. standard sieve scale). Typically, substantially all the particles have dimensions in the range of 2 to 18 microns, preferably 2 to 14 microns.

The metal and binder particles are mixed with an inert liquid vehicle by mechanical mixing (e.g. roll mills) to form a paste-like composition. The latter is printed as a thick film on conventional dielectric substrates such as alumina or on such an alumina substrate coated with a thin layer substantially 50 μm of alumina mixed with glass in the conventional manner. Any inert liquid may be used as the vehicle such as water or any one of various organic liquids with or without thickening or stabilizing agents, or other common additives. Exemplary of the organic liquids which can be used are the terpenes, such as pine oils, terpineol and the like.

The ratio of inert liquid vehicle to solids in the dispersions may vary considerably and depends upon the manner in which the dispersion is to be applied and the kind of vehicle used. While broad proportions of solids to vehicle can be used with the inorganic materials of this invention, preferred compositions comprise the proportions of noble metal, binder and vehicle set forth in the summary of the invention above. The compositions of the present invention may, of course, be modified by the addition of other materials which do not affect their beneficial characteristics.

After drying to remove the inert vehicle, firing of the compositions of the present invention is carried out at temperatures and for times sufficient to sinter the inorganic materials and to produce conductor patterns adherent to the dielectric substrate. Depending upon the properties desired and composition used, preferred firing temperatures are generally in the range of from 920°–930° C., preferably about 925° C., and the time at peak temperature is about ten minutes.

EXAMPLES

The following examples are presented to illustrate the invention. In the examples and throughout the specification and claims all percentages, proportions, ratios, etc., are by weight unless otherwise specifically stated.

Compositions were made using 90.6–91.4 parts of inorganic solids (gold and binder) in 8.6–9.4 parts of a vehicle of a solvent based on terpineol with a thioxotropic agent. The glass used in each example was the glass disclosed in U.S. Pat. No. 3,970,590.

In each sample of the material used (gold and binder) substantially all the particles were equal to or greater than 2 microns and equal to or smaller than 18 microns in diameter. In each example, binder, noble metal, and vehicle were physically mixed and the resultant composition was printed through a 325 mesh screen (U.S. standard sieve scale) made from stainless steel wire 0.028 mm in diameter onto a substrate made from 96–97% alumina and having dimension of 2 mm×80 mm×80 mm which is coated with a layer of alumina mixed with glass in the range of from 50 μm thick. The screen had 50 uniformly spaced openings 2.4 mm square with the substrate surface being divided into 10 rectangles having dimensions of 16 mm×40 mm. Five of the 2.4 mm square openings are aligned and uniformly spaced in said rectangle. The printed compositions were allowed to level at a temperature in the range of from 110° to 130° C. for 15 minutes minimum in an air atmosphere. The dried compositions on the substrates were then fired in an air atmosphere in an oven, or furnace, at a temperature of 925° C.±5° C. for seven minutes minimum. Rise and fall rates of the temperature were from 60° to 100° C. per minute. The total cycle time is 40 to 45 minutes. The fired thickness of the conductor lead pads was about 20±4 μm. The substrates are then sawed into ten substantially equal test strips with 5 2.4 mm square lead pads of the pattern of fired composition on each strip. The lead pads on each test strip were not abraded, burnished or chemically cleaned except that each test strip was degreased by being immersed in 1,1,1 trichlorethane and then dried using nitrogen gas. Each test strip is then preheated in a Brown Bonder to a temperature of 135° C.±5° for three minutes. Each conductor lead pad of a strip is then brushed with a pure waterwhite noncorrosive rosin flux produced by Alpha Metals Inc. which is sold under the trade name 5002 Microflux, while the bonder is being cycled to +240°±5° C. A solder preform of 50% indium, 50% lead is then placed on each of the five lead pads on a test strip and allowed to flow for two seconds. The test strip is then allowed to cool for two minutes.

A tin coated 20 AWG copper lead wire is dipped into a solder pot containing 50% indium, 50% lead solder at +265°±5° C. with a layer of 5002 flux on top of the solder. After the wire was coated with solder it is dipped into perchloroethane at +80°±5° C. to clean off the flux. the conductor lead pads with solder on them are then brushed with rosin flux. The test strip is then placed on a fixture and transferred to a hot plate where it is held at a temperature of 240°±5° C. When the solder starts to reflow, the presoldered wire lead is placed in the center of a conductor lead pad. The test strip is left on the hot plate for substantially two minutes from the time of solder reflow and then removed. After the test strip has cooled, to solidify the solder, flux is removed by dipping the test strip with wires soldered to the conductor lead pads in perchloroethylene at +80°±5° C.

The test strips with the solder wires is then left at room temperature for from 16 to 24 hours prior to "zero" hour adhesion measurements being made and prior to the beginning of thermal aging. The substrates which are aged are stored in an oven at a temperature of 75°±2° C. or 100°±2° for various time periods.

To determine the peel strength of the solder bond between a wire lead and a lead pad of a conductor pattern to which it is soldered, the wire lead is bent so as to be perpendicular to the substrate, i.e., so that the center line of the portion of the wire perpendicular to the substrate is substantially 1.5 millimeters from the edge of the lead pad to which it is soldered. The substrate with the test wires so bent is then mounted on the test instrument, a Chatillon Model HTCM pull tester. A load is applied to a wire in a direction perpendicular to the bond plane at a point determined by the bending radius, substantially ½ inch per minute. As each lead pad is tested, a record is made of the strengths recorded by the instrument at the time a failure occurs. Further, the failure mode is noted. If the wire separates from the solder, the failure is denoted (WS). If the solder separates from the solder pad, it is denoted (SP). If the wire, solder, and the conductor lead pad as an entity separates from the substrate, such a failure is denoted (PD). Finally if the conductor lead pad separates, or the conductor lead pad substantially splits in two along a plane parallel to the top surface of the test strip, such a failure is denoted as (SPD) since it appears to be a combination of the SP and PD modes. The more desirable types of failure are a ductile failure in the solder (WS or SP). The least desirable type of failure is a failure between a lead pad and the substrates (PD).

A composition of the conductor material of a pattern was prepared having the components in the proportions set forth below.

TABLE II

| Component | Proportion |
|---|---|
| Gold | 99.0 |
| Cu | .07 |
| Cd | .21 |
| Pb | .22 |
| Glass | .44 |

The results of pull tests on test strips conducted as described above on the composition of Table II were as follows:

TABLE III

| | TEMP | HRS | NMBR | AVG | STD DEV | FORCE IN POUNDS LOW | FORCE IN POUNDS HIGH |
|---|---|---|---|---|---|---|---|
| (1) | 25 | 0 | 10 | 3.56 | .32 | 3.1 | 4.0 |
| PD 10 | 3.6 | | | | | | |
| (2) | 100 | 48 | 10 | 2.96 | .26 | 2.6 | 3.6 |
| PD 10 | 3.0 | | | | | | |
| (3) | 100 | 260 | 10 | 1.72 | .38 | 1.2 | 2.3 |
| PD 10 | 1.7 | | | | | | |

In Table III Line (1) the 10 samples were held at room temperatures 25° overnight which is denoted zero hours. The mean or average force at which the solder joints failed their peel strength is 3.56 lbs., the standard deviation is 0.32 lbs., the weakest joint failed at 3.1 lbs. and the strongest at 4.0 lbs. In the line immediately below line (1) the types of failure and number of occasions of each type of failure are listed plus the average force to the nearest tenth at which each such type of failure occurred.

EXAMPLE 2

A pattern of lead pads was printed, dried and fired on a substrate as in Example 1. The composition in this example had components in the proportion set forth in Table IV.

TABLE IV

| Component | Proportion |
|---|---|
| Gold | 99.0 |
| Cu | .09 |
| Pb | .23 |
| Cd | .23 |
| Glass | .46 |

The results of pull tests on test strips conducted as described above on the composition of Table IV were as follows:

TABLE V

| | TEMP | HRS | NMBR | AVG | STD DEV | FORCE IN POUNDS LOW | FORCE IN POUNDS HIGH |
|---|---|---|---|---|---|---|---|
| | 25 | 0 | 50 | 6.01 | 1.14 | 4.5 | 9.1 |
| WS 1 | 8.6 | PD48 | 5.9 | CP.1 | 6.8 | | |
| | 75 | 48 | 15 | 5.77 | .54 | 5.1 | 7.0 |
| PD 14 | 5.7 | SPD1 | 6.2 | | | | |
| | 75 | 168 | 15 | 4.76 | .84 | 3.3 | 6.1 |
| PD 15 | 4.8 | | | | | | |
| | 75 | 336 | 15 | 5.33 | .46 | 4.2 | 5.8 |
| PD 15 | 5.3 | | | | | | |
| | 75 | 672 | 15 | 5.05 | .53 | 3.8 | 5.6 |
| PD 14 | 5.0 | SPD1 | 5.2 | | | | |
| | 75 | 1008 | 5 | 2.68 | .57 | 2.2 | 3.6 |
| PD 5 | 2.7 | | | | | | |
| | 75 | 1680 | 10 | .00 | .00 | .0 | .0 |
| PD 10 | .0 | | | | | | |
| | 100 | 48 | 15 | 5.23 | .38 | 4.5 | 6.0 |
| PD 15 | 5.2 | | | | | | |
| | 100 | 168 | 15 | 3.97 | .39 | 3.4 | 4.8 |
| PD 15 | 4.0 | | | | | | |
| | 100 | 336 | 15 | .00 | .00 | .0 | .0 |
| PD 15 | .0 | | | | | | |
| | 100 | 672 | 15 | .00 | .00 | .0 | .0 |
| PD 15 | .0 | | | | | | |
| | 100 | 1008 | 15 | .00 | .00 | .0 | .0 |
| PD 15 | .0 | | | | | | |

EXAMPLE 3

The test strips were prepared as in Example 1 and the tests conducted as described with respect to Example 1. The composition of the material of the conductor patterns had components in the proportions set forth in Table IV.

TABLE VI

| Component | Proportion |
|---|---|
| Gold | 98.91 |
| Cu | .10 |
| Cd | .25 |
| Pb | .24 |
| Glass | .48 |

The results of pull tests on test strips conducted as described above on the composition of Table IV were as follows:

TABLE VII

| | TEMP | HRS | NMBR | AVG | STD DEV | FORCE IN POUNDS LOW | HIGH |
|---|---|---|---|---|---|---|---|
| | 25 | 0 | 10 | 5.85 | .36 | 5.4 | 6.4 |
| PD 10 | 5.8 | | | | | | |
| | 75 | 240 | 10 | 5.28 | .36 | 4.9 | 5.9 |
| PD 10 | 5.3 | | | | | | |

EXAMPLE 4

The test strips were prepared as in Example 1 and the tests conducted as described with respect to Example 1. The composition of the material of the conductor patterns had components in the proportions set forth in Table VIII.

TABLE VIII

| Component | Proportion |
|---|---|
| Gold | 98.9 |
| Cu | .13 |
| Pb | .24 |
| Cd | .24 |
| Glass | .48 |

The results of pull tests on test strips conducted as described above on the composition of Table VIII were as follows:

TABLE IX

| | TEMP | HRS | NMBR | AVG | STD DEV | FORCE IN POUNDS LOW | HIGH |
|---|---|---|---|---|---|---|---|
| | 25 | 0 | 50 | 7.18 | .62 | 6.0 | 9.0 |
| PD 11 | 6.9 | CP27 | 7.1 | | | | |
| | 75 | 48 | 15 | 6.93 | .87 | 5.6 | 8.4 |
| SPD 14 | 6.8 | | | | | | |
| | 75 | 168 | 15 | 6.82 | .30 | 6.2 | 7.3 |
| CP 14 | 6.8 | | | | | | |
| | 75 | 336 | 15 | 7.19 | .63 | 6.4 | 9.0 |
| SPD 14 | 7.2 | | | | | | |
| | 75 | 672 | 15 | 7.86 | .63 | 6.8 | 8.9 |
| WS 3 | 8.3 | SP7 | 7.7 | SPD5 | 7.8 | | |
| | 75 | 1008 | 5 | 6.28 | 1.10 | 4.5 | 7.1 |
| SPD 5 | 6.3 | | | | | | |
| | 75 | 1680 | 10 | 1.22 | 1.09 | .0 | 2.7 |
| PD 10 | 1.2 | | | | | | |
| | 100 | 48 | 15 | 6.12 | .55 | 5.3 | 7.2 |
| PD 2 | 5.6 | SPD13 | 6.2 | | | | |
| | 100 | 168 | 15 | 5.41 | .75 | 4.0 | 6.2 |
| CD 12 | 5.2 | | | | | | |
| | 100 | 336 | 15 | 2.69 | .78 | 1.7 | 4.1 |
| PD 11 | 2.4 | SPD4 | 3.5 | | | | |
| | 100 | 672 | 15 | .11 | .44 | .0 | 1.7 |
| PD 15 | .1 | | | | | | |
| | 100 | 1008 | 15 | .00 | .00 | .0 | .0 |
| PD 15 | .0 | | | | | | |

EXAMPLE 5

The test strips were prepared as in Example 1 and the tests conducted as described with respect to Example 1. The composition of the material of the conductor patterns had components in the proportions set forth in Table X.

TABLE X

| Component | Proportion |
|---|---|
| Gold | 99.0 |
| Cu | .20 |
| Pb | .20 |
| Cd | .20 |

TABLE X-continued

| Component | Proportion |
|---|---|
| Glass | .40 |

The results of pull tests on test strips conducted as described above on the composition of Table X were as follows:

TABLE XI

| | TEMP | HRS | NMBR | AVG | STD DEV | FORCE IN POUNDS LOW | HIGH |
|---|---|---|---|---|---|---|---|
| | 25 | 0 | 35 | 7.27 | .90 | 5.8 | 9.9 |
| WS 6 | 8.5 | SP1 | 9.0 | PD9 | 6.4 | SPD19 | 7.2 |
| | 100 | 48 | 15 | 5.54 | .91 | 4.6 | 8.0 |
| PD 13 | 5.3 | CP2 | 7.1 | | | | |
| | 100 | 168 | 15 | 5.25 | .66 | 4.3 | 6.8 |
| PD 19 | 5.5 | CP5 | 4.8 | | | | |
| | 100 | 336 | 15 | .43 | .60 | .0 | 1.8 |
| PD 15 | .4 | | | | | | |
| | 100 | 672 | 15 | .00 | .00 | .0 | .0 |
| PD 15 | 0 | | | | | | |
| | 100 | 1008 | 15 | .00 | .00 | .0 | .0 |
| PD 15 | .0 | | | | | | |

EXAMPLE 6

The test strips were prepared as in Example 1 and the tests conducted as described with respect to Example 1. The composition of the material of the conductor patterns had components in the proportions set forth in Table XII.

TABLE XII

| Component | Proportion |
|---|---|
| Gold | 98.8 |
| Cu | .3 |
| Pb | .21 |
| Cd | .21 |
| Glass | .42 |

The results of pull tests on test strips conducted as described above on the composition of Table XII were as follows:

TABLE XIII

| | TEMP | HRS | NMBR | AVG | STD DEV | FORCE IN POUNDS LOW | HIGH |
|---|---|---|---|---|---|---|---|
| | 25 | 0 | 50 | 7.63 | .52 | 7.6 | 9.0 |
| WS 2 | 8.8 | PD1 | 7.6 | CP5 | 8.0 | | |
| | 75 | 48 | 15 | 7.77 | .67 | 8.3 | 8.9 |
| WS 1 | 8.9 | CP1 | 8.3 | | | | |
| | 75 | 168 | 15 | 7.49 | .59 | 7.0 | 8.5 |
| CP 9 | 7.8 | | | | | | |
| | 75 | 336 | 15 | 8.18 | .77 | 8.8 | 9.5 |
| SPD 3 | 9.1 | | | | | | |
| | 75 | 672 | 15 | 7.60 | .78 | 6.8 | 9.4 |
| WS 2 | 8.8 | SP13 | 7.4 | | | | |
| | 75 | 1008 | 5 | 4.55 | .65 | 3.7 | 5.5 |
| SPD 5 | 4.5 | | | | | | |
| | 75 | 1680 | 10 | 2.85 | .37 | 2.3 | 3.5 |
| PD 10 | 2.9 | | | | | | |
| | 100 | 48 | 15 | 7.44 | .67 | 6.0 | 8.4 |
| CP 4 | 7.7 | | | | | | |
| | 100 | 168 | 15 | 6.90 | .58 | .0 | .0 |
| | 100 | 336 | 15 | 3.61 | .59 | 2.8 | 4.8 |
| PD 6 | 3.3 | SPD9 | 3.3 | | | | |
| | 100 | 672 | 15 | .00 | .00 | .0 | .0 |
| PD 15 | .0 | | | | | | |
| | 100 | 1008 | 15 | .00 | .00 | .0 | .0 |
| PD 15 | .0 | | | | | | |

EXAMPLE 7

The test strips were prepared as in Example 1 and the tests conducted as described with respect to Example 1. The composition of the material of the conductor patterns had components in the proportions set forth in Tale XIV.

TABLE XIV

| Component | Proportion |
|---|---|
| Gold | 98.5 |
| Cu | .54 |
| Cd | .22 |
| Pb | .22 |
| Glass | .48 |

The results of pull tests on test strips conducted as described above on the composition of Table XIV were as follows:

TABLE XV

| | TEMP | HRS | NMBR | AVG | STD DEV | FORCE IN POUNDS Low | HIGH |
|---|---|---|---|---|---|---|---|
| | 75 | 168 | 14 | 7.83 | 1.22 | 5.6 | 9.4 |
| SP 8 | 7.7 | PD1 | 7.2 | SPD1 | 7.3 | CP4 | 8.5 |
| | 75 | 336 | 14 | 7.52 | 1.32 | 5.9 | 9.8 |
| WS 3 | 9.3 | SP8 | 7.1 | SPD1 | 6.5 | CP2 | 7.2 |
| | 75 | 672 | 14 | 7.39 | 1.30 | 5.8 | 9.9 |
| WS 3 | 9.3 | SP8 | 6.4 | CP3 | 8.1 | | |
| | 75 | 1008 | 14 | 7.23 | 1.19 | 5.9 | 9.8 |
| WS 5 | 8.5 | SP9 | 6.5 | | | | |
| | 100 | 336 | 14 | 5.20 | 1.36 | 3.7 | 8.2 |
| WS 1 | 7.6 | SP11 | 4.8 | CP2 | 6.1 | | |
| | 100 | 672 | 14 | 4.23 | .69 | 3.2 | 5.5 |
| SP 5 | 4.7 | SPD9 | 3.9 | | | | |
| | 100 | 1008 | 14 | 1.99 | .51 | 1.4 | 3.2 |
| PD 14 | 2.0 | | | | | | |

EXAMPLE 8

The test strips were prepared as in Example 1 and the tests conducted as described with respect to Example 1. The composition of the material of the conductor patterns had components in the proportions set forth in Table XVI.

TABLE XVI

| Component | Proportion |
|---|---|
| Gold | 97.86 |
| Cu | 1.16 |
| Cd | .22 |
| Pb | .22 |
| Glass | .54 |

It should be noted that test strips having the composition of Table XV could not be soldered until after they had been abraded physically or chemically cleaned. After being appropriately cleaned, leads were soldered to the pads of the strips. The results of pull tests on such test strips after being cleaned and then soldered were as follows:

TABLE XVII

| | TEMP | HRS | NMBR | AVG | STD DEV | FORCE IN POUNDS LOW | HIGH |
|---|---|---|---|---|---|---|---|
| | 100 | 168 | 15 | 7.20 | 1.07 | 5.1 | 9.4 |
| WS 7 | 7.9 | SP6 | 6.4 | CP2 | 7.1 | | |
| | 100 | 336 | 15 | 6.30 | .98 | 4.2 | 7.4 |
| WS 6 | 7.0 | SP7 | 5.7 | CP2 | 6.5 | | |
| | 100 | 672 | 15 | 5.15 | 1.05 | 3.9 | 7.7 |
| WS 1 | 7.7 | SP13 | 4.8 | CP1 | 6.9 | | |
| | 100 | 1008 | 14 | 4.64 | .62 | 3.3 | 5.5 |
| SPD 14 | 4.6 | | | | | | |

Figure 2:
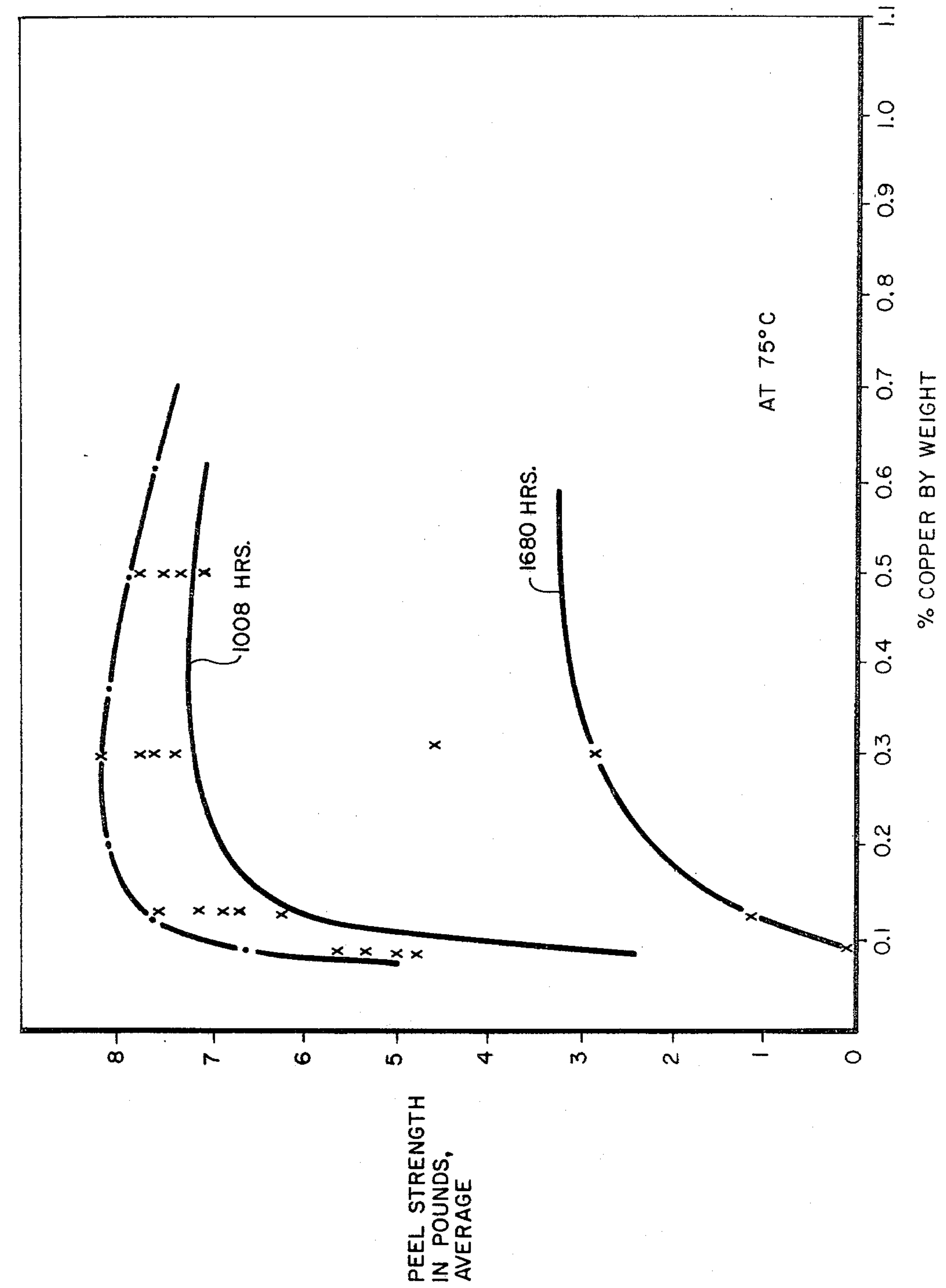
FIG. 2 is similar to FIG. 1 but shows the relationship between the average peel strength in pounds of such solder joints as a function of the percent of copper by weight of the composition of the solder pads after the test samples are aged, or exposed, to a temperature of 75° C. for the periods of time indicated.
Figure 3:
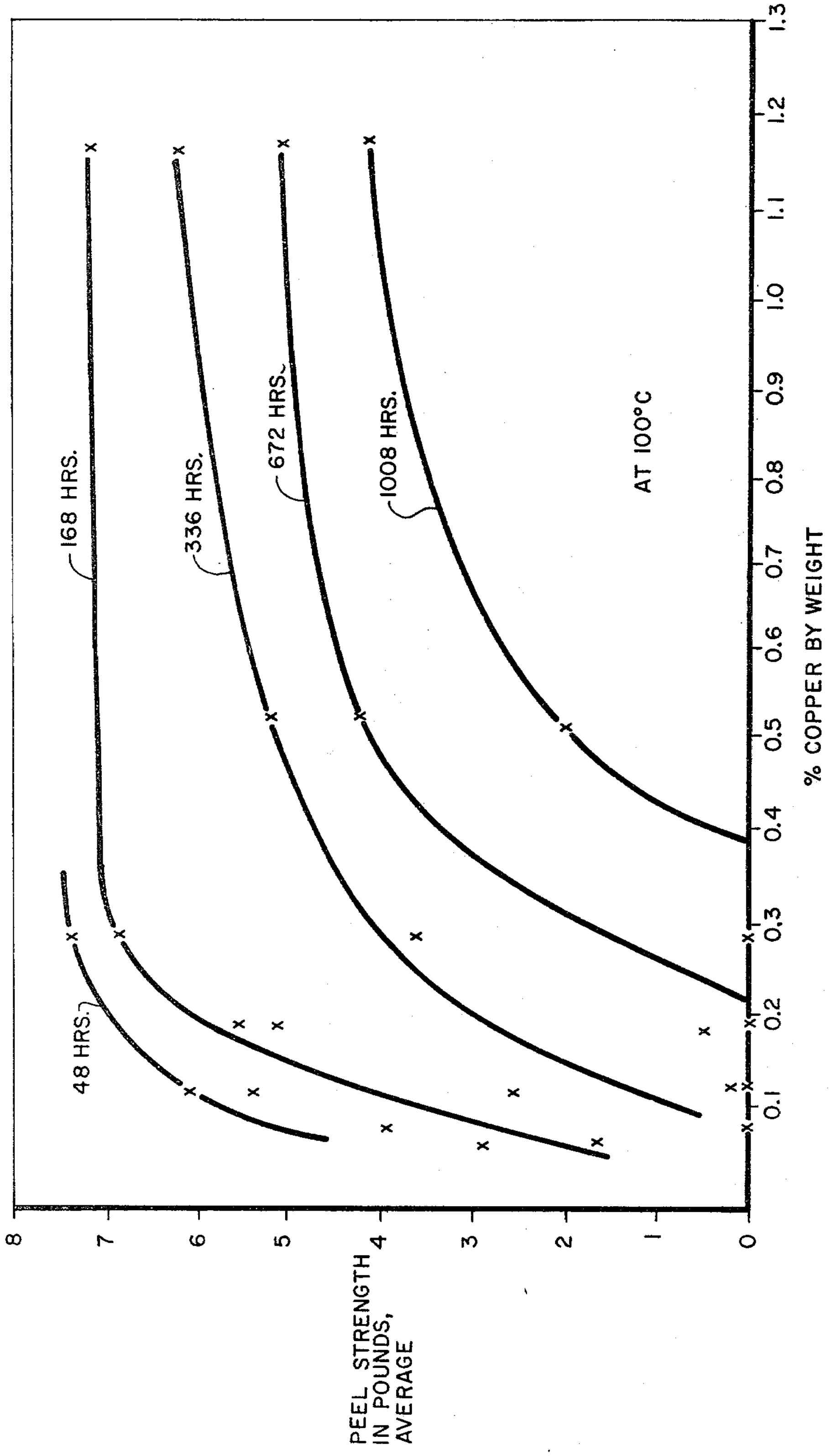
FIG. 3 is similar to FIG. 2 except that the solder joints were aged at a temperature of 100° C. for the times indicated prior to determining the average peel strength of the joints.

The data of Tables III, V, VII, IX, XI, XIII, XV and XVII which provide the average peel strength in pounds at which the solder joints failed provide the points used in determining the curves of FIGS. 1, 2 and 3. Peel strength is the ordinate and the percent of copper is the abscissa. A perusal of FIG. 1 which is a plot of the points for no aging, or more accurately where the test samples were stored at room temperature for up to a maximum of 24 hours shows a very rapid drop off in the strength of such joints beginning at around 0.2% copper as the amount of copper is decreased with a substantial leveling off of the peel strength of such joints as the amount of copper is increased at least through 1.1% Cu.

The data used in FIG. 2 was obtained from test strips which were aged at 75° C., a temperature which approximates the upper end of the temperatures to which the joints would be subjected in electronic systems such as computers. There is a band of closely spaced points between tests after 48 hours and 1,008 hours of aging in which the pad strength of the solder joints does not decrease very rapidly as a function of time. Thereafter there is a rapid fall off in the peel strength between 1,000 hours and 1,680 hours. Again the curves drop off very rapidly when the amount of copper is reduced below 0.2%.

In FIG. 3, the data was obtained from test strips which were aged at 100° C. The curves show a decrease in peel strength as a fraction of aging time. Again there is a rapid drop off in peel strength as the amount of copper in the composition is decreased below 0.2% but an increase in the strength of the joints after aging as the amount of copper is increased. The test results indicate that increasing the amount of copper tends to increase the strength of the joints particularly after aging.

However, somewhere in the range of from 0.54 and 1.1% of copper the fired composition can no longer be soldered without some form of chemical or physical cleaning of the pattern after it has been sintered on the substrate. Thus, Applicants have discovered that there is an optimum range in the amount of copper in the composition between 0.2% and 0.6% at which the pattern is solderable without having to be cleaned and produces solder joints of acceptable strength. It should be noted that the peel strength of the joints decreases more slowly as a function of aging as the amount of copper is increased until a maximum amount of copper is present. However, beyond a maximum amount of Cu the fired composition must be cleaned immediately prior to soldering if good solder joints are to be obtained, which is an unacceptable condition. In all such tests the adhesion of the fired composition to the substrate after firing was good.

In general the peel strengths of the samples having less than 0.2% copper have a relatively rapid rate of degradation as a function of time and temperature with the lower limit of the amount of copper that will produce joints of acceptable strength being about 0.2%. In the range of from 0.2 to 0.6% copper the strength of such joints both initially and after aging has more stability for longer periods of time under each thermal condition. While the 1.0% copper composition exhibited excellent initial characteristics and aging characteristics, it does not have the desirable attribute of being solderable without being prepared either by physical abrasion or by a chemical cleaning. The lower limit of the desired range of the copper is 0.2% and the upper limit is substantially 0.6%.

What is claimed is:

1. The method of soldering a lead to a lead pad on a substrate comprising the steps of:

printing a conductor pattern including at least one lead pad on the substrate using a gold composition, said gold composition being composed of finely divided gold particles and finely divided inorganic binder particles dispersed in an inert liquid vehicle, by weight 98 to 99 percent gold particles and complementally 2.0 to 1.0 percent inorganic binder particles, the binder consisting essentially by total weight of gold and binder of:

0.6 to 0.2 percent copper 0.2 percent lead 0.2 percent cadmium and the balance glass;

firing the substrate to sinter the inorganic materials of the gold composition;

presoldering the lead pad with a lead indium solder using a noncorrosive solder flux;

presoldering a lead with a lead indium solder using a noncorrosive solder flux; and soldering the presoldered lead to the presoldered lead pad using a noncorrosive solder.

2. The method of soldering a lead to a lead pad on a substrate comprising the steps of: printing a conductor pattern including at least one lead pad on the substrate using a gold composition, said gold composition being composed of finely divided gold particles and finely divided inorganic binder particles dispersed in an inert liquid vehicle, by weight 98 to 99% gold particles and complementally 2.0 to 1.0% inorganic binder particles, the binder consisting essentially by total weight of gold and binder of:

0.6 to 0.2 percent copper 0.2 percent lead 0.2 percent cadmium and the balance glass:

allowing the print to level at room temperature: heating the substrate to a temperature substantially not exceeding 130° C. until substantially dry;

firing the substrate to sinter the inorganic materials;

vapor degreasing the fired substrate;

applying a noncorrosive solder flux to the lead pad;

placing a solder preform on the lead pad;
heating the substrate to allow the solder on the lead pad to liquify:
cooling the substrate to solidify the solder;
presoldering a lead;
cleaning the flux off of the lead;
applying a noncorrosive solder flux to the solder on the lead pad;
heating the substrate to a temperature at which the solder begins to reflow:
placing the presoldered wire on the lead pad;
maintaining the solder in a liquid state for a predetermined period of time;
cooling the substrate to ambient temperature, and
cleaning the substrate and the lead soldered to the lead pad.

3. The method of soldering a copper lead to a lead pad on an alumina substrate having a thin dielectric layer of alumina mixed with glass on one surface of the substrate comprising the steps of: printing a conductor pattern including a lead pad on the dielectric layer of the substrate using a gold composition, said gold composition being composed of finely divided gold particles and finely divided inorganic binder particles dispersed in an inert liquid vehicle, by weight 98.5% gold particles and complementally 1.5% inorganic binder particles, the binder consisting essentially by total weight of gold and binder of:
0.5 percent copper
0.2 percent lead
0.2 percent cadmium, and the balance glass;
allowing the print to level at room temperature,
drying the print for twenty minutes in air at a temperature of from 110° to 130° C.;
firing the substrate at a temperature of 125°±5° C. for seven minutes minimum, the rise and fall rate being from 60° to 100° C. per minute, the total cycle time being of the order of 40-45 minutes in air;
vapor degreasing the fired substrate with trichloroethane;
drying the substrate with nitrogen gas;
placing the substrate in a preheat stage and raising the temperature to 135° C.±5° for three minutes;
applying a non-activated liquid rosin solder flux to the lead pad at a temperature of about 240°±5° C.;
placing a solder preform 50% indium, 50% lead on the lead pad;
allowing the solder to flow for two seconds;
cooling the substrate for approximately two minutes;
presoldering a copper lead with 50% indium, 50% lead;
dipping the presoldered lead into pure trichloroethylene at plus 80°±5° C. to clean off the flux;
applying a non-activated liquid rosin solder flux to the solder on the lead pad;
heating the substrate to a temperature at which the solder on the lead pad begins to reflow;
placing the presoldered wire in the liquid solder on the lead pad;
continuing to heat the substrate to maintain the solder in a liquid state for approximately two minutes; and
cooling the substrate, the lead pad and the lead; and cleaning the substrate and lead soldered to the lead pad with trichloroethylene at plus 80°±5° C.

* * * * *